(12) United States Patent
Karim et al.

(10) Patent No.: US 8,199,236 B2
(45) Date of Patent: Jun. 12, 2012

(54) DEVICE AND PIXEL ARCHITECTURE FOR HIGH RESOLUTION DIGITAL

(75) Inventors: Karim Sallaudin Karim, Waterloo (CA); Farhad Taghibakhsh, Toronto (CA)

(73) Assignee: Simon Fraser University/Industry Liason Office, Burnaby, British Columbia (CA)

( * ) Notice: Subject to any disclaimer, the term of this patent is extended or adjusted under 35 U.S.C. 154(b) by 612 days.

(21) Appl. No.: 12/207,871

(22) Filed: Sep. 10, 2008

(65) Prior Publication Data
US 2009/0147118 A1 Jun. 11, 2009

(30) Foreign Application Priority Data
Sep. 11, 2007 (CA) ...................................... 2603302

(51) Int. Cl.
*H04N 5/335* (2011.01)
*H04N 3/14* (2006.01)
*H04N 5/235* (2006.01)

(52) U.S. Cl. ...... 348/302; 348/294; 348/308; 348/230.1

(58) Field of Classification Search .................. 348/302, 348/281, 311, 294, 297, 300, 301, 308, 230.1; 257/378, 59; 250/208.1; 327/110, 109, 434; 323/259, 285
See application file for complete search history.

(56) References Cited

U.S. PATENT DOCUMENTS

| | | | |
|---|---|---|---|
| 5,083,016 A | 1/1992 | Wyles et al. | |
| 5,389,567 A * | 2/1995 | Acovic et al. | 438/594 |
| 5,528,059 A * | 6/1996 | Isogai | 257/187 |
| 5,665,959 A | 9/1997 | Fossum et al. | |
| 5,892,540 A | 4/1999 | Kozlowski et al. | |
| 5,981,932 A | 11/1999 | Guerrieri et al. | |
| 6,130,423 A | 10/2000 | Brehmer et al. | |
| 6,194,740 B1 | 2/2001 | Zhang et al. | |
| 6,486,504 B1 | 11/2002 | Guidash | |
| 7,342,253 B2 * | 3/2008 | Sun et al. | 257/72 |
| 7,573,518 B2 | 8/2009 | Nakamura et al. | |
| 7,924,332 B2 * | 4/2011 | Gruev et al. | 348/308 |
| 2002/0114530 A1 * | 8/2002 | Duarte | 382/254 |
| 2002/0154225 A1 | 10/2002 | Matsumoto et al. | |

(Continued)

FOREIGN PATENT DOCUMENTS
JP H08(1996)-256293 10/1996
(Continued)

OTHER PUBLICATIONS

Taghibakhsh, K.S. Karim, "Amplified Pixel Sensor Architectures for Low Dose Computed Tomography . . .", Proceedings of SPIE, (2007), vol. 6510, Burnaby, BC, Canada.

(Continued)

*Primary Examiner* — Jason Chan
*Assistant Examiner* — Stephen Coleman
(74) *Attorney, Agent, or Firm* — Gottlieb, Rackman & Reisman, P.C.

(57) ABSTRACT

The present invention discloses structure of a two-gate field effect transistor (FET), named as charge gated FET, and presents various active pixel sensor (APS) and multimode architectures using the device which has only one, or two on-pixel transistors for high resolution, high gain and fast frame rate APS arrays. It is also disclosed a new method of addressing pixels of an APS array by applying the addressing voltage pulse directly to the gate of the amplifying transistor of the pixel architecture, eliminating the row select transistor from the pixel circuit.

21 Claims, 14 Drawing Sheets

U.S. PATENT DOCUMENTS

| | | | |
|---|---|---|---|
| 2002/0171773 A1 | 11/2002 | Gower et al. | |
| 2002/0190215 A1* | 12/2002 | Tashiro et al. | 250/370.11 |
| 2004/0152268 A1* | 8/2004 | Chu et al. | 438/266 |
| 2004/0182990 A1* | 9/2004 | Dai | 250/208.1 |
| 2005/0041128 A1 | 2/2005 | Baker | |
| 2005/0068707 A1* | 3/2005 | Takada | 361/103 |
| 2005/0195305 A1* | 9/2005 | Lyu et al. | 348/308 |
| 2006/0027843 A1* | 2/2006 | Ogura et al. | 257/291 |
| 2006/0038222 A1* | 2/2006 | Kan et al. | 257/315 |
| 2006/0146159 A1 | 7/2006 | Farrier | |
| 2007/0187609 A1* | 8/2007 | Karim | 250/370.09 |
| 2008/0259182 A1 | 10/2008 | Karim et al. | |
| 2009/0050997 A1* | 2/2009 | Mutoh | 257/440 |
| 2009/0101941 A1* | 4/2009 | Ellis-Monaghan et al. | 257/270 |
| 2009/0147118 A1 | 6/2009 | Karim et al. | |
| 2009/0268070 A1 | 10/2009 | Hosier | |

FOREIGN PATENT DOCUMENTS

| | | |
|---|---|---|
| JP | H09(1998)-051476 | 2/1997 |
| JP | H10(1998)-336525 | 12/1998 |
| JP | 2000-078463 | 3/2000 |
| JP | 2002-320146 | 10/2002 |
| JP | 2003-057113 | 2/2003 |
| JP | 2003-134396 | 5/2003 |
| JP | 2003-209746 | 7/2003 |
| WO | WO 96/34416 | 10/1996 |
| WO | WO 97/05659 | 2/1997 |
| WO | WO 00/19706 | 4/2000 |
| WO | WO 02/067337 | 8/2002 |
| WO | WO 03/061277 | 7/2003 |
| WO | WO 03/073507 | 9/2003 |
| WO | WO 2005/015639 | 2/2005 |
| WO | WO 2006/042407 | 4/2006 |

OTHER PUBLICATIONS

Taghibakhsh, K.S. Karim, "High dynamic range 2-TFT amplified pixel sensor architecture . . .", IET Circuits Devices Syst., 2007, pp. 87-92, vol. 1, No. 2, Burnaby, BC, Canada.

G. Sanaie-Fard, et al., "High Dynamic Range Pixel Ampliflier Architecture . . .", 106th Meeting of the Electrochemical Society: (TFTT VII), PV 2004-15, pp. 289-300 Burnaby, BC, CA.

K.S. Karim et al. (2004), "High Dynamic Range Pixel Architectures . . .", in Medical Imaging 2004: Physics of Medical Imaging, SPIE, vo. 5368, pp. 657-667.

K.S. Karim et al, (2003), "Amorphous Silicon Active Pixel Sensor • Readout Circuit . . .", IEEE Trans. on Electron Devices, 50 (1), pp. 200-208.

K.S. Karim and A. Nathan, (2002) "On-Pixel Amorphous Silicon . . .", in Integrated Opto-electronics, The Electrochemical Society Proceedings vol. PV2002-4, pp. 313-332.

Karim S. Karim, et al., "Active Pixel Sensor Architectures in a-SiH for Medical Imaging", J. Vac. Sci. Technol. A, vol. 20, No. 3, pp. 1095-1099, May 2002.

K.S.Karim, A. Nathan et al.,(2000) "Amorphous Silicon Pixel . . .", International Electron Devices Meeting, digest 2002, pp. 215-218.

Karim, K.S. et al., (2001), "Alternate Pixel Architectures for Large Area . . .", Medical Imaging 2001: Physics of Medical Imaging Proceedings of SPIE, vol. 4320, pp. 35-46.

Spyros Kavadias et al, (2000), "A Logarithmic Response CMOS Image Sensor with On chip Calibration" IEEE Journal of Solid-State Circuits, vol. 35, No. 8.

Karim, K.S. et al., (2000), "Active Pixel TFT Array for Digital . . .", Electrochemical Society Proceedings, vol. 2000, No. 31, pp. 320-332.

Huang ,Zhong-Shou and Ando, T. (1990) "Temperature dependence of the output of a stacked and amplified . . .", Jap. Journal of Applied Physics, 29 (2), part 2, pp. L 240-242.

* cited by examiner

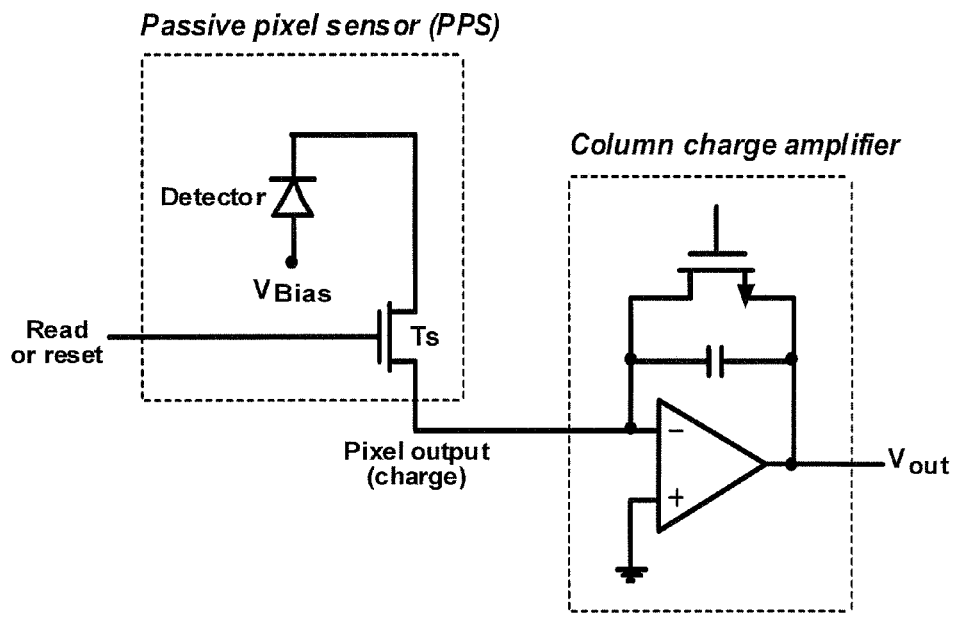
Figure 1.a – PRIOR ART
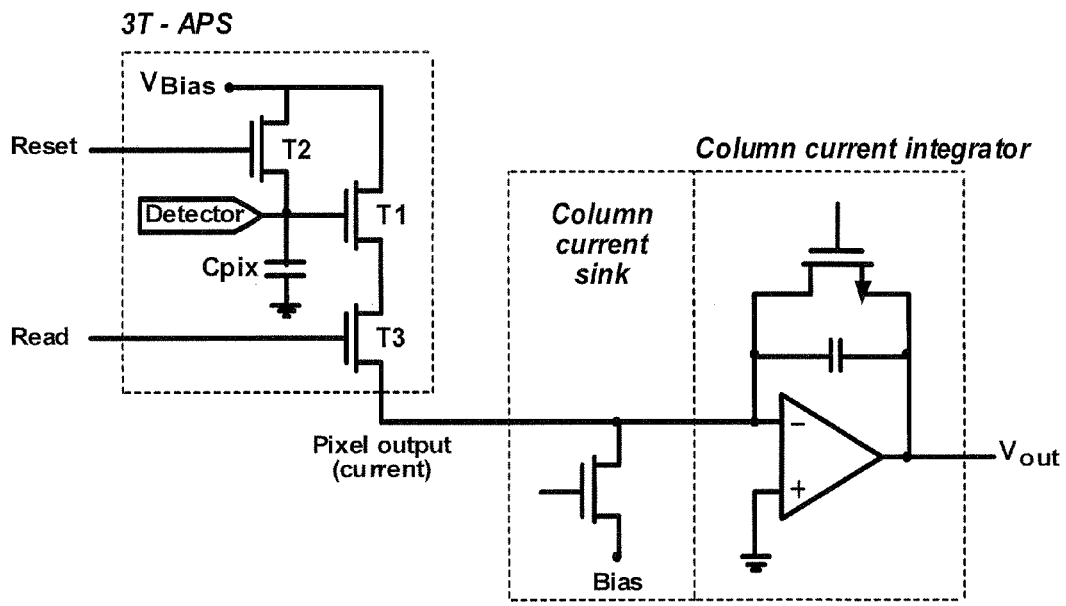
Figure 1.b – PRIOR ART

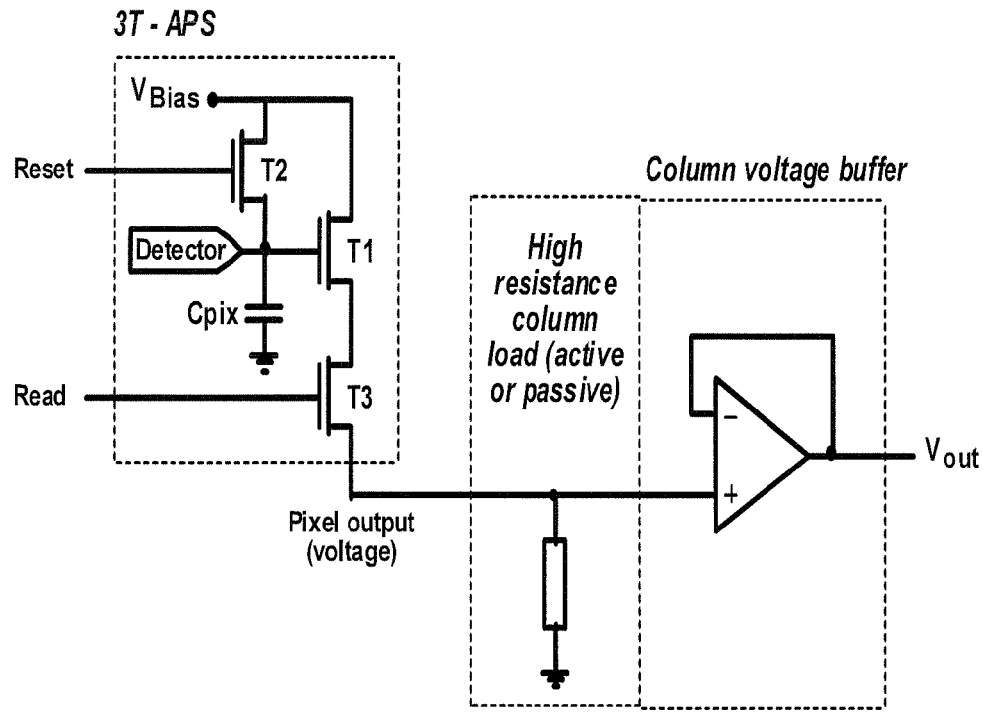
Figure 1.c – PRIOR ART
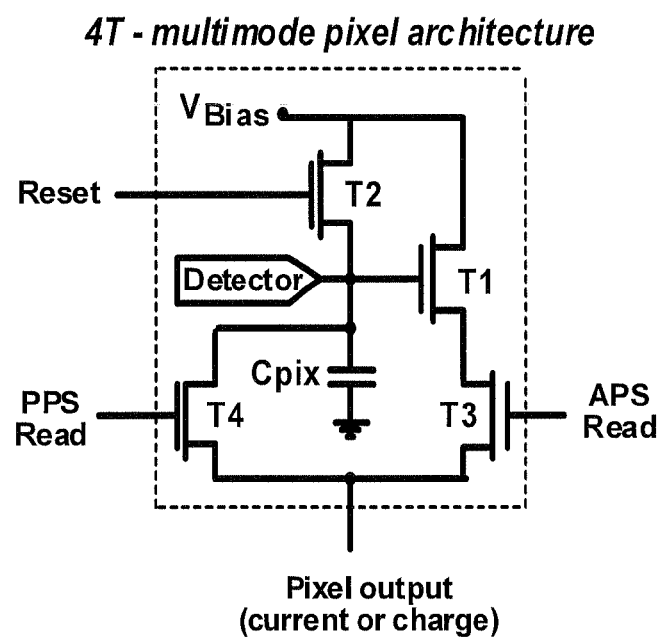
Figure 2.a – PRIOR ART

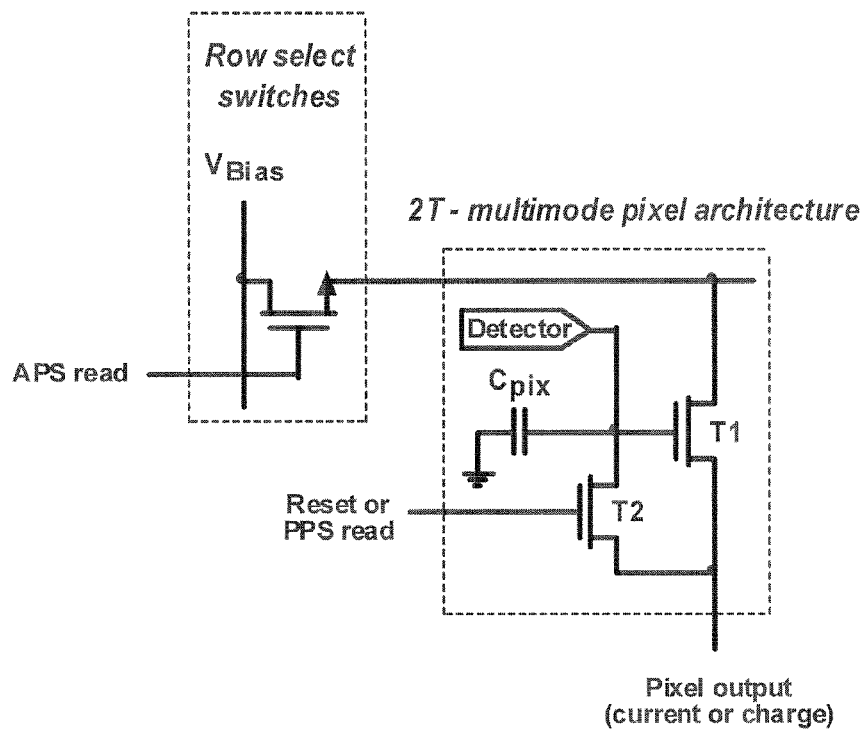
Figure 2.b – PRIOR ART
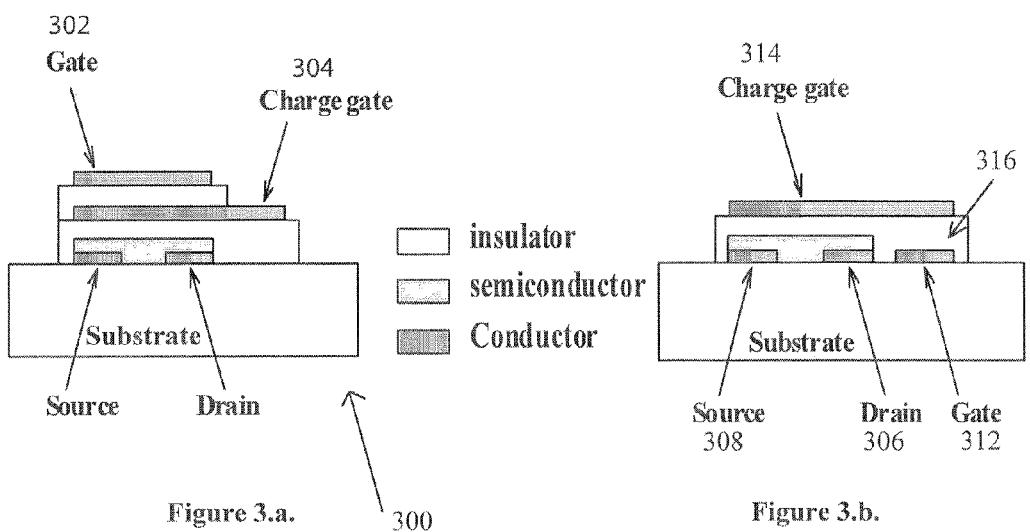
Figure 3.a.
Figure 3.b.

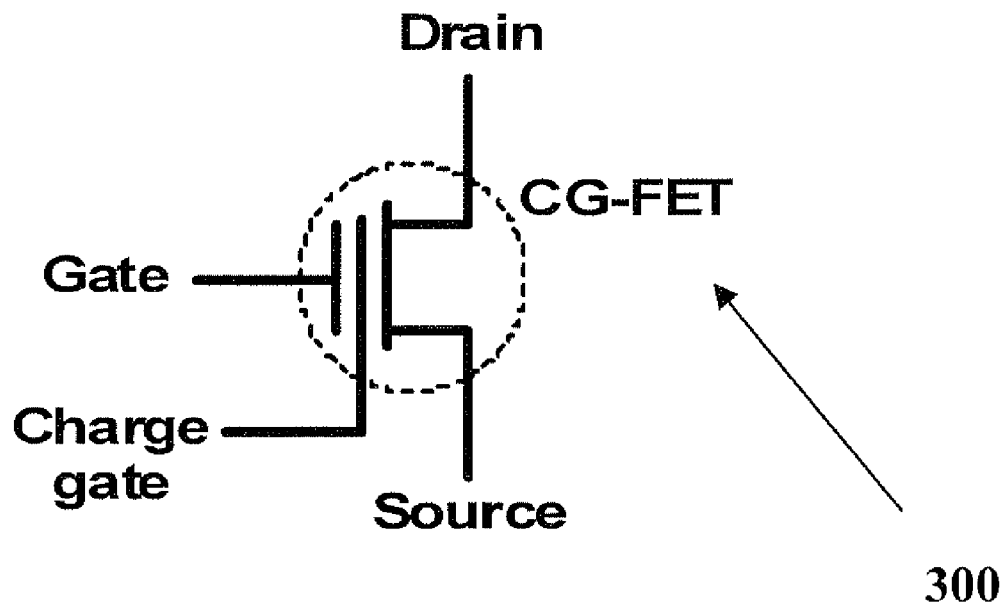
Figure 3.c.
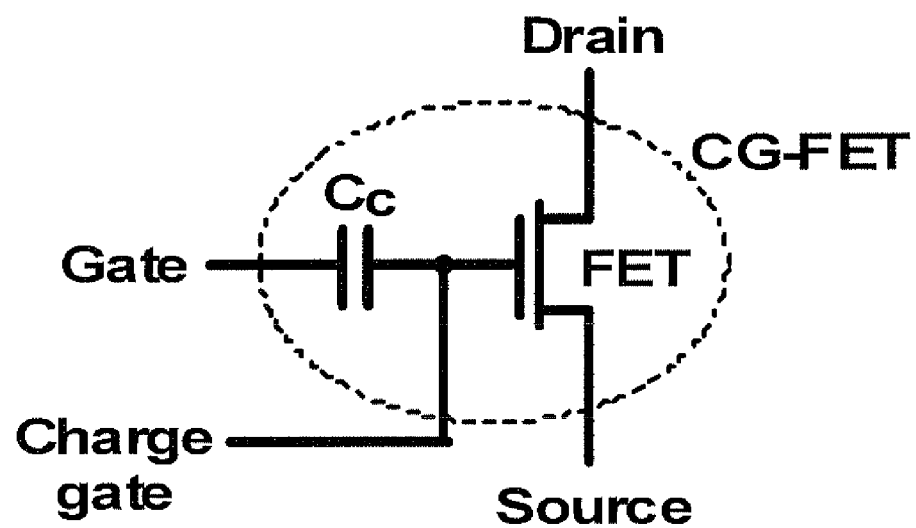
Figure 3.d.

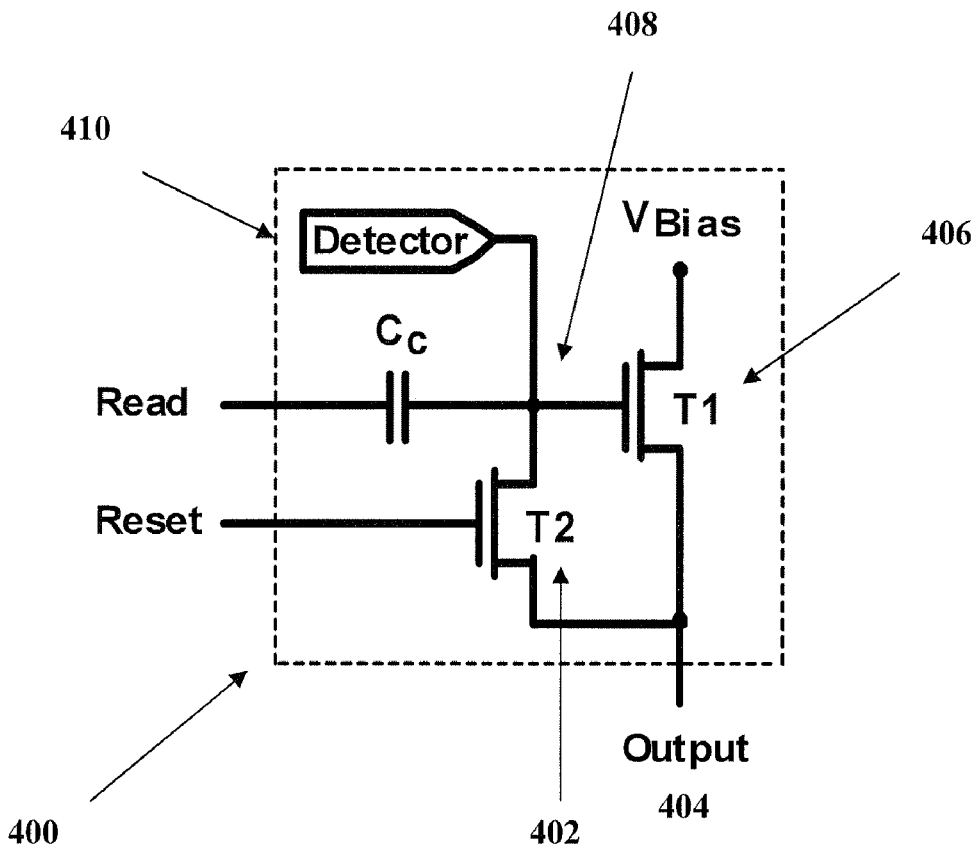
Figure 4.a.
| [APS] | Resetting | Integration | Readout |
|---|---|---|---|
| Read | 0 | 0 | High |
| Reset | High | 0 | 0 |
| Output | 0 | 0 | Signal |
| T1-T2 | OFF-ON | OFF-OFF | ON-OFF |
Figure 4.b.

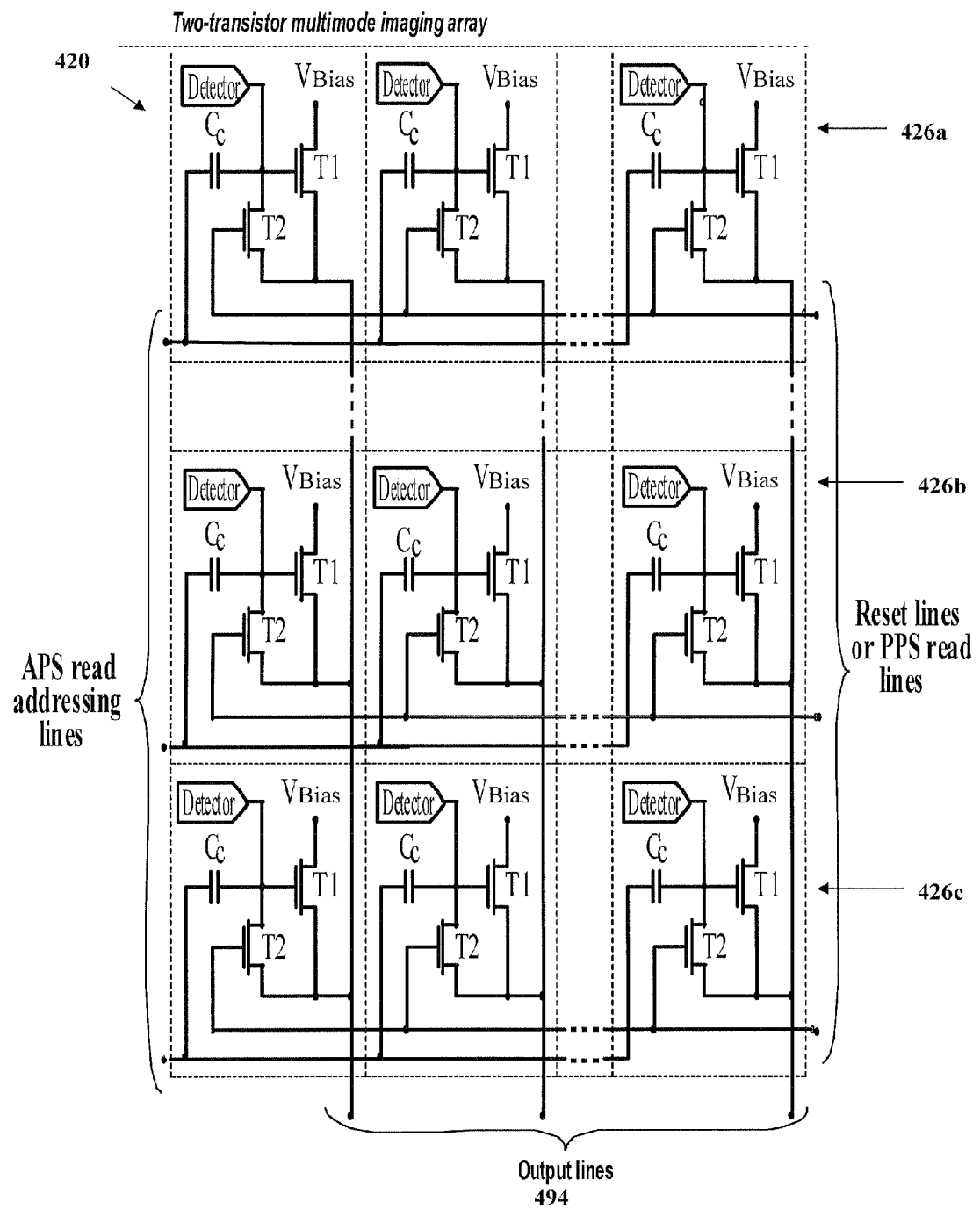
Figure 4.c.

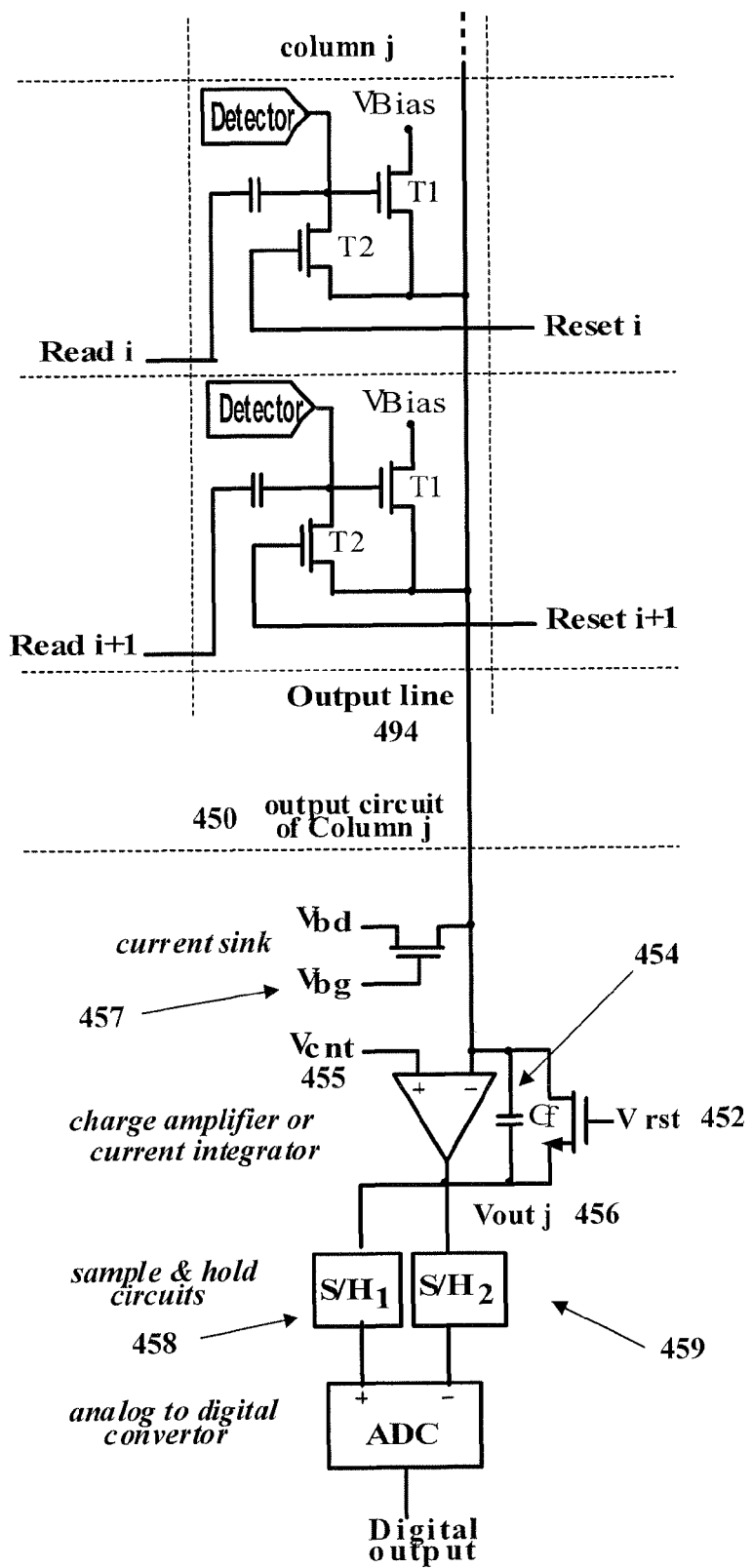
Figure 4.d.

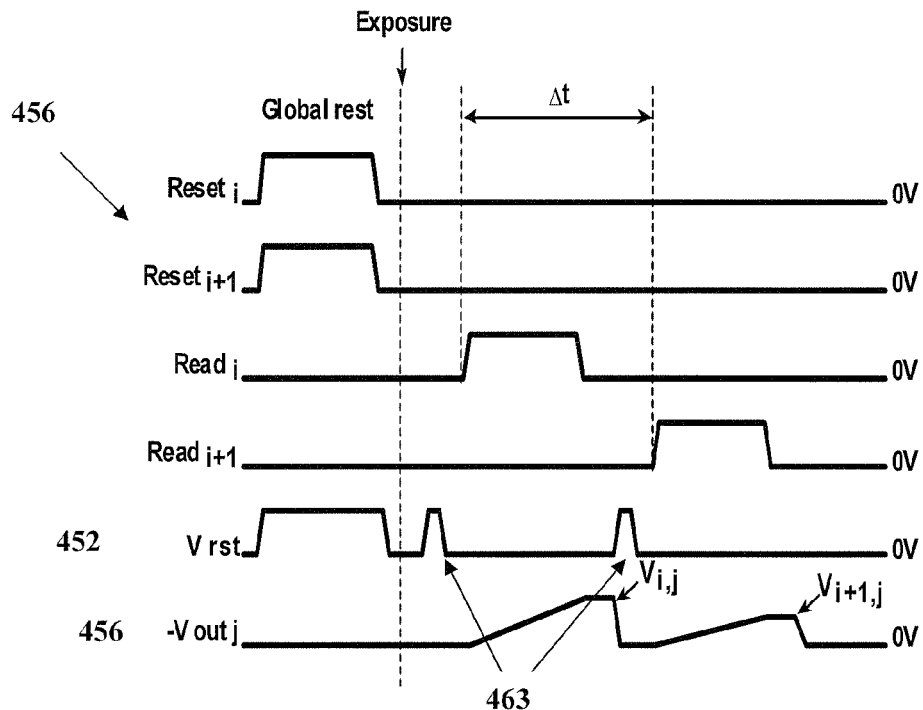
Figure 4.e.
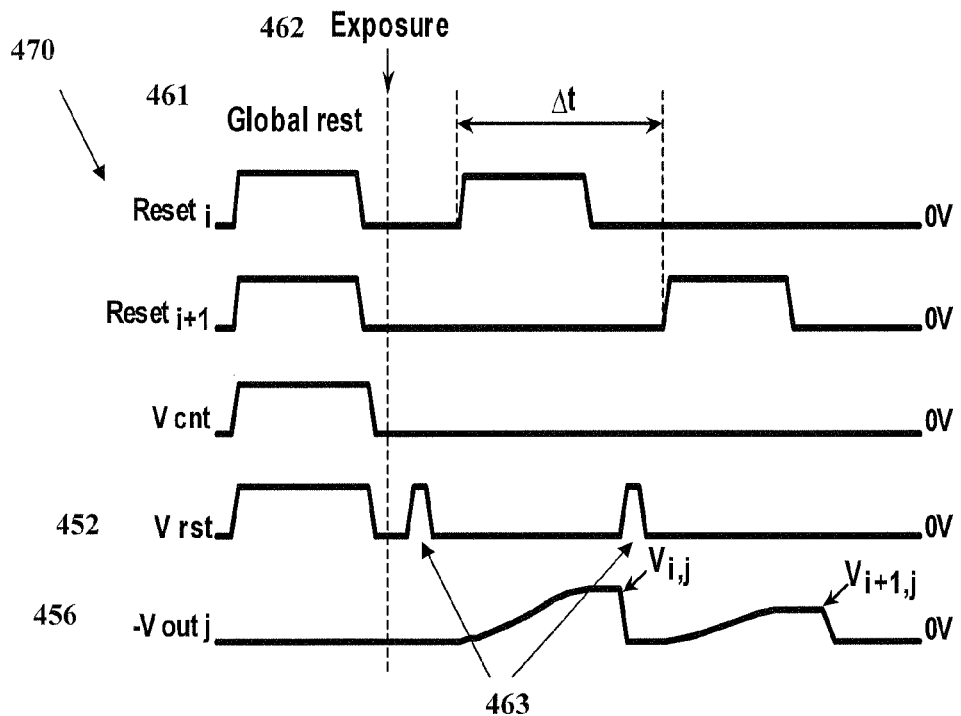
Figure 4.f.

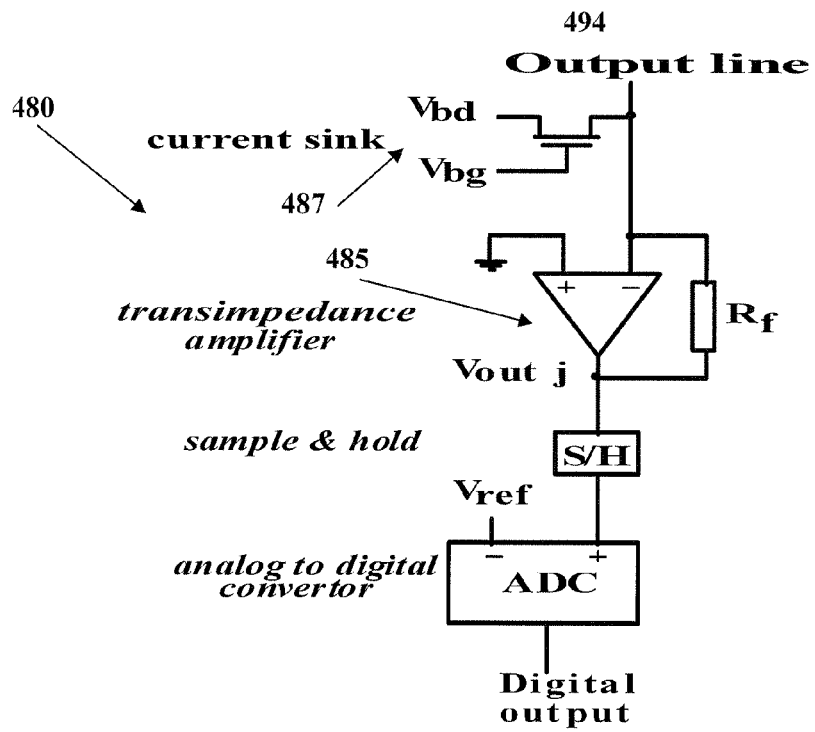
Figure 4.g.
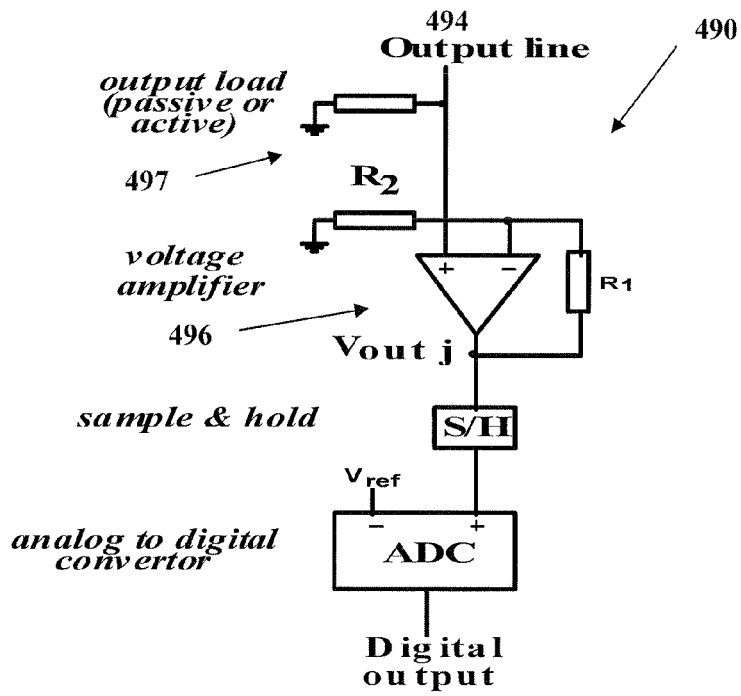
Figure 4.h.

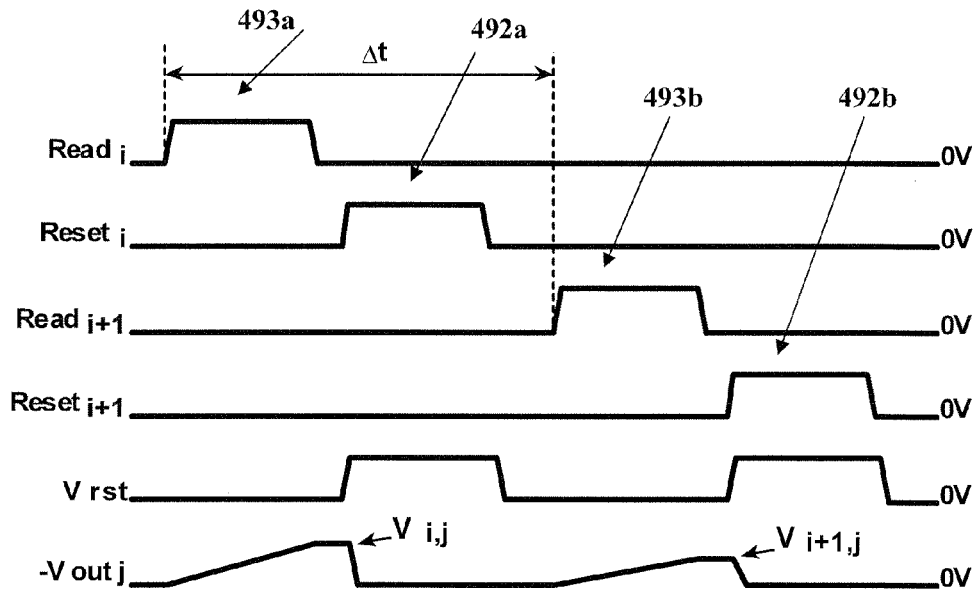
Figure 4.i.
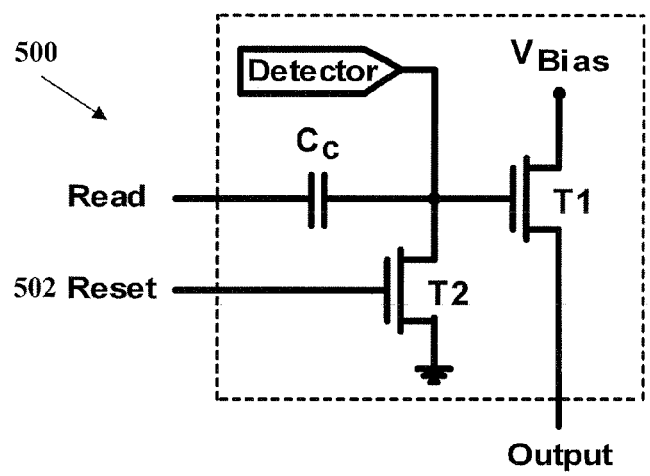
Figure 5.a.
|  | Resetting | Integration | Readout |
|---|---|---|---|
| 512 Read | 0 | 0 | High |
| 514 Reset | High | 0 | 0 |
| Output | - - - | 0 | Signal |
| T1-T2 | OFF-ON | OFF-OFF | ON-OFF |
Figure 5.b.

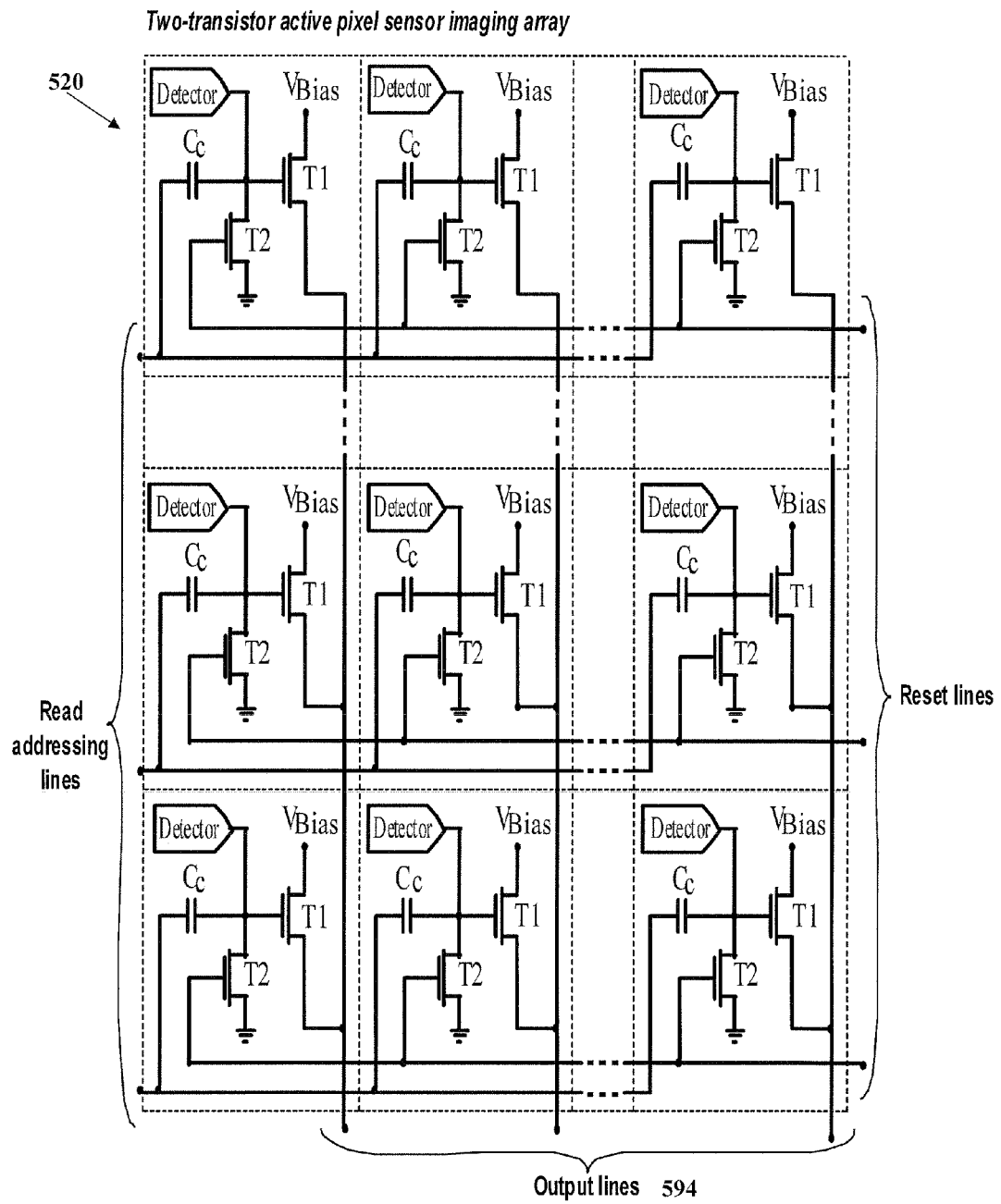
Figure 5.c.

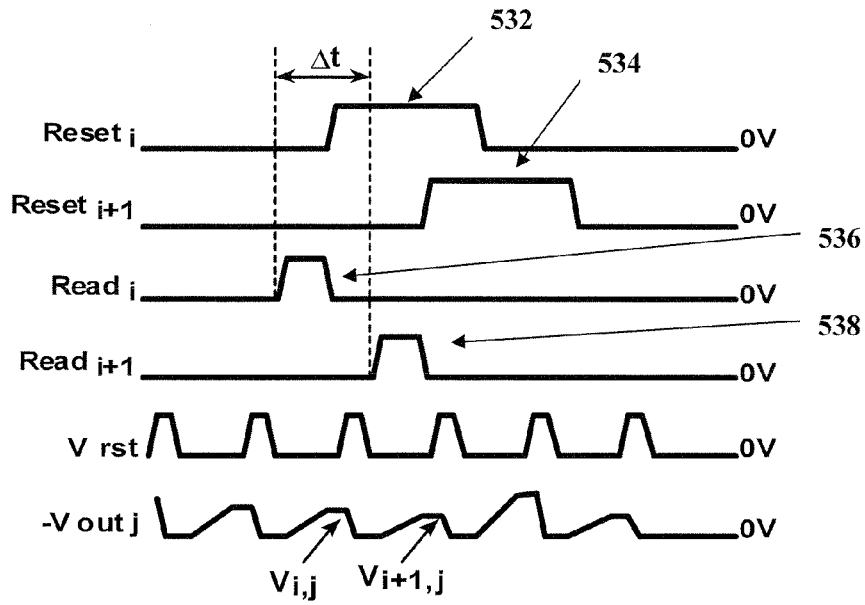
Figure 5.d.
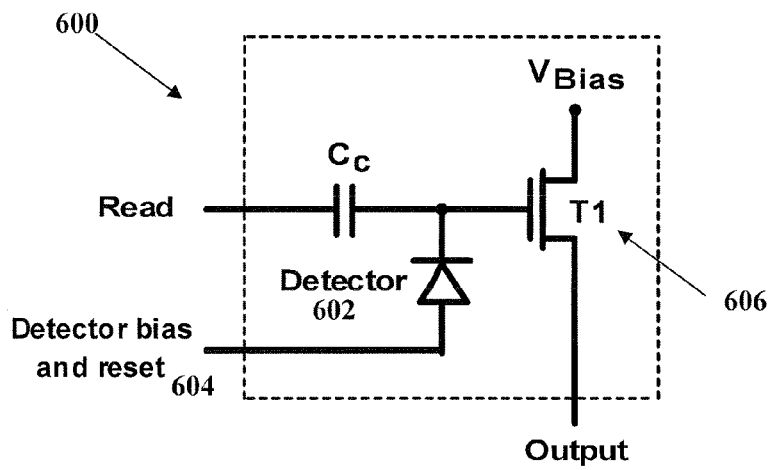
Figure 6.a.
|  | Resetting | Integration | Readout |
|---|---|---|---|
| Read | 0 | 0 | High |
| Reset | V+ | V- | V- |
| Output | --- | 0 | Signal |
| T1-D | OFF-ON | OFF-OFF | ON-OFF |
Figure 6.b.

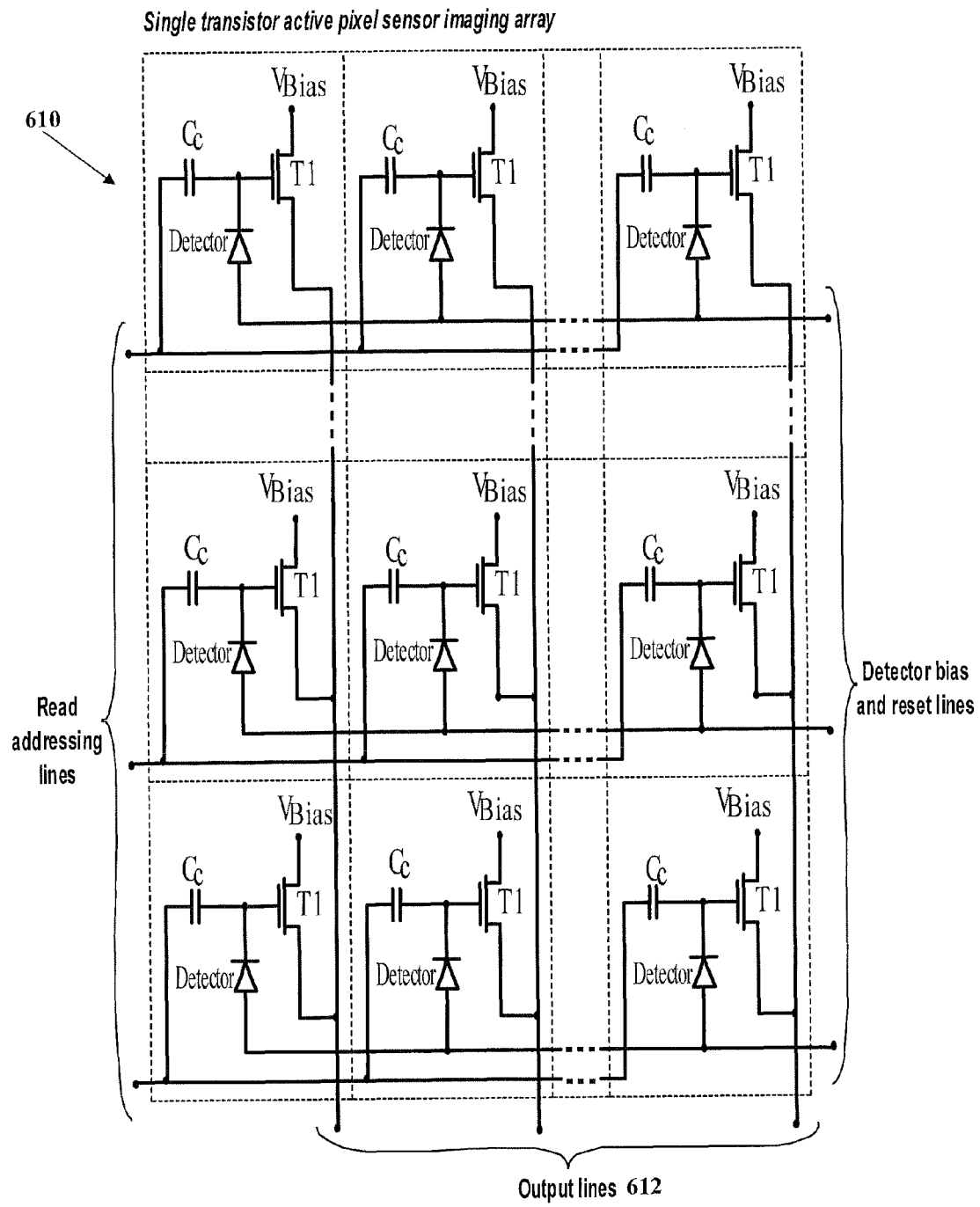
Figure 6.c.

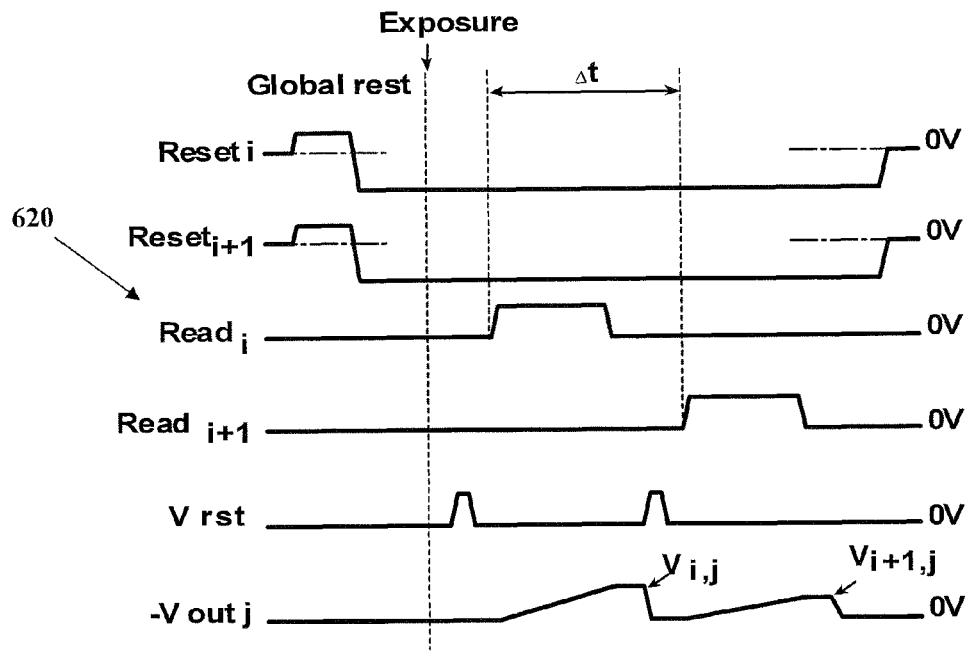
Figure 6.d.
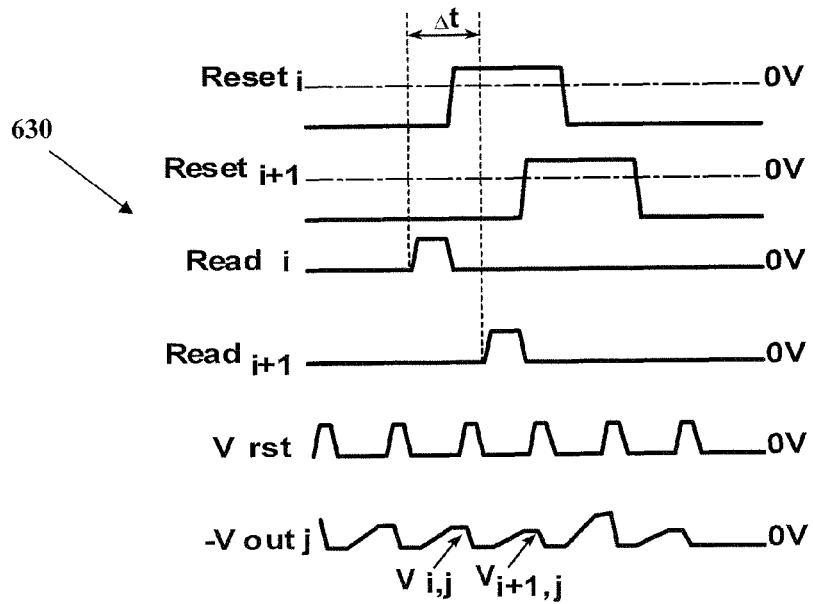
Figure 6.e.

DEVICE AND PIXEL ARCHITECTURE FOR HIGH RESOLUTION DIGITAL

FIELD OF THE INVENTION

The present invention pertains to the field of active pixel sensor arrays, and in particular to a charge-gated transistor device and high-resolution imagers employing active pixel sensor architectures.

BACKGROUND

The term digital imaging refers to the function of a system capable of producing a digital electronic image from optical image information. Such a system is usually consisted of a matrix of pixelated optical detectors each associated with their own electronic circuits (which together are called pixels), connected to peripheral circuits (biasing, addressing, readout and digitizer circuitries).

One of the commonly used architectures for large area imaging is the passive pixel sensor (PPS) shown in FIG. 1.a. Here, a detector, for example, an amorphous selenium (a-Se) based photoconductor, a Cesium Iodide (CsI) phosphor coupled to an amorphous silicon (a-Si:H) p-i-n photodiode, or even a crystalline p-n junction, is integrated with a readout circuit comprising a transistor switch such as an a-Si:H thin-film transistor (TFT). Signal charge is accumulated on the pixel sensor during an integration cycle and is transferred to an external charge amplifier via the transistor switch, $T_S$, during a readout/reset cycle. The transferred charge is converted to an equivalent voltage in the charge amplifier and is then further processed (using sampling and/or digitization) towards reconstruction of a digital image. It is noted that the pixel capacitance mentioned above is the p-i-n photodiode capacitance or an integrated storage capacitor for the a-Se photoconductor arrangement, or the p-n junction capacitance. Other additional analog signal processing sequences are also possible, for example, double sampling mechanisms are typically used to correct for the effect of non-uniformities within the circuitry. These non-uniformities may comprise process non-uniformities in the form of offsets, and, in the case of a-Si:H technology, non-uniformities in pixel circuit performance due to transistor instability. For example, International Patent Application Publication Nos. WO9634416 and WO9705659 further disclose flat-panel detectors for radiation imaging using PPS architecture.

While the PPS has the advantage of being compact and therefore suitable for high-resolution imaging, reading a small output signal of the PPS for low input optical signal results in a noisy voltage at the output of the charge integrator, due to the fact that charge integrators potentially add a considerable amount of noise to the input signal. This lowers the signal-to-noise ratio (SNR) at low signal levels, and thus, degrades the pixel dynamic range.

One approach for improved SNR is disclosed in International Patent Application Publication No. WO02067337 indicating that the SNR can be increased by employing in-situ, or pixel, amplification via an a-Si:H current-mediated active pixel sensor (C-APS) as depicted in FIG. 1.b. Reported gain, linearity and noise performance show an improvement and indicate that the a-Si:H C-APS, coupled with an established x-ray detection technology such as a-Se or CsI/p-i-n photodiodes, can meet the stringent requirements for low noise digital x-ray imaging for applications such as fluoroscopy, which no more than 1000 electrons of noise are allowed. In C-APS architecture, T2 is used to reset the voltage of the detector, and an on-pixel transconductance amplifier (T1) converts the detector voltage to an equivalent output current, which is then integrated in the column charge amplifier. The advantage of C-APS to PPS is the high gain; since the pixel capacitor is not discharged, a constant output current is provided as long as the row select transistor, T3, is on. Double sampling is necessary in C-APS to remove effects of non-uniformities among pixels.

Another approach disclosed in International Patent Application Publication No. WO02067337 reports a near-unity gain pixel amplifier, namely, an a-Si:H voltage-mediated active pixel sensor (V-APS). A V-APS architecture is illustrated in FIG. 1.c. The pixel configuration is exactly similar to that of C-APS architecture, however, in V-APS, the pixel output is the detector voltage which is buffered out by the pixel amplifier. The advantage of V-APS over PPS and C-APS is that the charge amplifier is replaced by a simple voltage buffer. This helps less complicated design and less expensive implementation of peripheral circuits. Like the C-APS, double sampling mechanisms can be applied to the V-APS to correct for the effect of non-uniformities within the circuitry.

A difference between C-APS and V-APS is in pixel output signal, i.e., current versus voltage, the pixel circuit of both architectures (FIGS. 1.b and 1.c) is otherwise the same, and is the basic structure of active pixel architecture, comprising three field effect transistors. Other variations of the basic architectures have been reported to improve functionality of the circuit. For example, International Patent Application Publication No. WO2000019706 disclose methods of high speed resetting of the pixel, or as another example, International Patent Application Publication No. WO2006042407 introduces multimode architectures for high dynamic range, and low noise imaging applications as illustrated in FIG. 2.a; a four-transistor approach. Other non classical architectures such as two-transistor multimode architectures have also been reported in F. Taghibakhsh, K. S. Karim, "High dynamic range 2-TFT amplified pixel sensor architecture for digital mammography tomosynthesis" IET Circuits Devices & Systems, vol. 1, no. 1, pp. 87-92, (2007), and F. Taghibakhsh, K. S. Karim, "Amplified Pixel Sensor Architectures for Low Dose Computed Tomography using Silicon Thin Film Technology", Proceedings of SPIE, vol. 6510, (2007). These architectures are shown in FIG. 2.b, where addressing each row is performed by providing a separate bias voltage for the entire row. Although such architectures provide smaller pixel size for higher imaging resolution, they require more complex peripheral circuits, and non standard driving methods. In this architecture, the row select (or read) transistor has been transferred from each pixel to its row. In all APS architectures at least three transistors are distinguished: 1) a transconductance amplifying transistor (T1) that its gate is connected to the pixel sensor/detector element, 2) a reset transistor (T2) that presets the voltage of the pixel sensor/detector element, and, and 3) a row select (or read) transistor (T3) that connects drain or source of the amplifying transistor to the imager matrix bus lines.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a device and pixel architecture for high resolution digital imaging. In accordance with an aspect of the present invention, there is provided a digital imaging apparatus comprising: a detector for generating a first signal in response to photons incident thereupon; and readout circuitry operatively coupled to the detector, said readout circuitry configured to generate a second signal representative of said first signal, said readout circuitry including an electron device comprising: a field effect transistor having a gate terminal, a drain terminal and a source terminal; and a conductor plate capacitively coupled to the gate terminal of said field effect transistor, wherein current flowing between the drain and source terminals of said field effect transistor can be modulated by a voltage applied to said conductor plate and by an electric charge residing on the gate terminal of said field effect transistor.

In accordance with another aspect of the present invention, there is provided a digital imaging system comprising an array of digital imaging apparatuses, each digital imaging apparatus comprising: a detector for generating a first signal in response to photons incident thereupon; and readout circuitry operatively coupled to the detector, said readout circuitry configured to generate a second signal representative of said first signal, said readout circuitry including an electron device comprising: a field effect transistor having a gate terminal, a drain terminal and a source terminal; and a conductor plate capacitively coupled to the gate terminal of said field effect transistor, wherein current flowing between the drain and source terminals of said field effect transistor can be modulated by a voltage applied to said conductor plate and by an electric charge residing on the gate terminal of said field effect transistor.

In accordance with another aspect of the present invention, there is provided a method of operating one or more selected digital imaging apparatuses in an array thereof, the method comprising capacitively applying an addressing signal to the gate of a transistor of each selected digital imaging apparatus.

In accordance with another aspect of the present invention, there is provided an electron device comprising a field effect transistor having a gate terminal, a drain terminal and a source terminal; and a conductor plate capacitively coupled to the gate terminal of said field effect transistor, wherein current flowing between the drain terminal and the source terminal of said field effect transistor can be modulated by a voltage applied to said conductor plate and by an electric charge residing on the gate terminal of said field effect transistor.

In accordance with another aspect of the invention, there is provided a single-transistor active pixel architecture for high resolution active imaging (as illustrated in FIG. 6.$a$), in which, the row select (or read) transistor is eliminated from the pixel circuitry, and the addressing signal is capacitively coupled to the gate of the amplifying transistor of the active pixel circuitry.

In accordance with another aspect of the invention, there is provided a two-transistor active pixel architecture for high resolution active imaging (as illustrated in FIG. 4.$a$), in which, the row select (or read) transistor is eliminated from the pixel circuitry, and the addressing signal is capacitively coupled to the gate of the amplifying transistor of the active pixel circuitry.

In accordance with another aspect of the invention, there is provided a method of addressing rows of active pixel sensor arrays in which, the 'row select' (or 'read') transistor is eliminated from the pixel circuitry, and the addressing signal is capacitively coupled to the gate of the amplifying transistor of the active pixel circuitry.

In accordance with another aspect of the present invention there is disclosed a charge-gated field effect transistor, in which a second gate is capacitively coupled to the gate (first gate) of a generic field effect transistor, and said second gate is used to switch the transistor ON and OFF, while being ON, the current flown between drain and source terminals of the said double gate transistor is modulated by amount of charge on the said first gate.

BRIEF DESCRIPTION OF THE FIGURES

FIG. 1.$a$. illustrates a passive pixel sensor (PPS) according to the prior art.

FIG. 1.$b$. illustrates a current-mediated active pixel sensor (C-APS) according to the prior art.

FIG. 1.$c$. illustrates a voltage-mediated active pixel sensor (V-APS) array according to the prior art.

FIG. 2.$a$. illustrates a 4-transistor multimode pixel sensor according to the prior art.

FIG. 2.$b$. illustrates a 2-transistor multimode (PPS and C-APS) pixel sensor according to the prior art.

FIG. 3.$a$. illustrates a charge-gated transistor according to an embodiment of the present invention.

FIG. 3.$b$. illustrates a charge-gated transistor according to another embodiment of the present invention.

FIG. 3.$c$. illustrates a circuit diagram of a charge-gated transistor according to an embodiment of the present invention.

FIG. 3.$d$. illustrates a circuit diagram of a charge-gated transistor according to another embodiment of the present invention.

FIG. 4.$a$. illustrates a two-transistor multimode pixel sensor architecture according to an embodiment of the present invention.

FIG. 4.$b$. illustrates operational cycles of the active pixel sensor architecture illustrated in FIG. 4.$a$ according to an embodiment of the present invention.

FIG. 4.$c$. illustrates an array configuration of the two-transistor multimode pixel architecture illustrated in FIG. 4.$a$ according to an embodiment of the present invention.

FIG. 4.$d$. illustrates an output circuit coupled to a two-transistor multimode pixel array according to an embodiment of the present invention.

FIG. 4.$e$. illustrates an example timing diagram for active mode readout of the circuit of FIG. 4.$d$. according to an embodiment of the present invention.

FIG. 4.$f$. illustrates an example timing diagram for passive mode readout of the circuit of FIG. 4.$d$. according to an embodiment of the present invention.

FIG. 4.$g$. illustrates an output circuit for coupling to one or more pixel sensors according to an embodiment of the present invention.

FIG. 4.$h$. illustrates an output circuit for coupling to one or more pixel sensors according to another embodiment of the present invention.

FIG. 4.$i$. illustrates an example timing diagram for active mode readout of one or more pixel sensors according to an embodiment of the present invention.

FIG. 5.$a$. illustrates a 2-transistor active pixel sensor with separate reset according to an embodiment of the present invention.

FIG. 5.$b$. illustrates operational cycles of the active pixel sensor architecture illustrated in FIG. 5.$a$ according to an embodiment of the present invention.

FIG. 5.$c$. illustrates an array configuration of the 2-transistor active pixel architecture illustrated in FIG. 5.$a$. according to an embodiment of the present invention.

FIG. 5.$d$. illustrates an example timing diagram for high frame rate readout of one or more pixel sensors according to an embodiment of the present invention.

FIG. 6.*a*. illustrates a single-transistor active pixel sensor architecture according to an embodiment of the present invention.

FIG. 6.*b*. illustrates operational cycles of the single-transistor active sensor architecture illustrated in FIG. 6.*a* according to an embodiment of the present invention.

FIG. 6.*c*. illustrates an array configuration of the single-transistor active pixel architecture illustrated in FIG. 6.*a*. according to an embodiment of the present invention.

FIG. 6.*d*. illustrates an example timing diagram for readout of the array illustrated in FIG. 6.*c*. according to an embodiment of the present invention.

FIG. 6.*e*. illustrates an example timing diagram for real time operation of the array illustrated in FIG. 6.*c*. according to an embodiment of the present invention.

DETAILED DESCRIPTION OF THE INVENTION

Definitions

The term "detector" is used to define a device that converts photons of radiation in any region of the electromagnetic spectrum to electrical charge directly or indirectly.

The term "transistor" is used to define a device for switching, amplifying or transconducting purposes. Such transistor could be a thin film transistor (TFT), field effect transistor (FET), bipolar junction transistor or other similar device as would be readily understood by a worker skilled in the art.

The term "pixel" is used to define an imaging element consisting of one or more detectors coupled to a readout circuit.

The term "readout circuit" is used to define an electronic circuit consisting of one or more transistors that connects the detector to the peripheral circuits.

The term "peripheral circuit" is used to define electronic circuits connected to a pixel (or array of pixels) monolithically or externally, necessary to operate the imager for generating digital image information.

The term "architecture" is used to define the configuration of the detector and its readout circuit in a pixel.

Unless defined otherwise, all technical and scientific terms used herein have the same meaning as commonly understood by one of ordinary skill in the art to which this invention belongs.

The present invention provides active pixel digital imaging architectures comprising detectors coupled to readout circuitry, wherein the readout circuitry may generate amplified signals when compared to the passive architecture PPS. Each detector generates photo-carriers in response to photons incident upon the detector and produces charge, which results in a voltage change across the detector or a capacitor associated with the detector. This voltage change produces the input signal to the readout circuitry, which then outputs a voltage or current signal representative of the detector signal.

In one embodiment of the present invention, there is provided an imaging apparatus comprising a detector for generating a first signal in response to photons incident thereupon and readout circuitry operatively coupled to the detector. The readout circuitry is configured to generate a second signal representative of said first signal, for example the amplitude of the second signal can represent the first signal. The readout circuitry comprises an electron device. The electron comprises a field effect transistor and a conductor plate capacitively coupled to the gate terminal of said field effect transistor. Current flowing between drain and source terminals of the field effect transistor can be modulated by a voltage applied to said conductor plate and by an electric charge residing on the gate terminal of said field effect transistor. In another embodiment, an array of such imaging apparatuses is provided, each apparatus for example comprising one or two transistors.

Each pixel typically comprises one detector, however it is contemplated that more than one detector may be present within each pixel. In addition, the readout circuitry may be partially present within the on-panel pixels and partially present off the imaging panel, or substantially present on the imaging panel. The imaging panel may be rigid, for example comprising a glass substrate, or flexible, for example comprising a flexible plastic or flexible metal substrate. In addition, the present invention may comprise more than one imaging panel. For example, one panel may comprise some parts of the sensor and another panel may comprise other parts of the sensor. Furthermore, the pixel electronics may be fabricated on a single chip or on multiple chips. Furthermore, the readout circuitry present within a pixel may be physically located in the same plane as the detector or this readout circuitry may be embedded under, or fabricated above, the detector to provide a high fill factor.

Portions of the readout circuitry that are common for a column, row, or group of pixels may be multiplexed between these pixels in an array. Thus it would be readily understood by a worker skilled in the art, that in the various embodiments of the present invention, common column, row or group readout circuitry may be multiplexed between pixels, and that this may require additional circuitry, for example switching circuits or multiplexing circuits. In addition, multiplexers may also be used to reduce the readout circuit complexity by decreasing the total number of digital counters, for example, required for a column, row, or group of pixels. Furthermore, common column or row readout circuitry may also be implemented such that the common readout circuitry is individual to each pixel. It would also be understood that the pixels of various embodiments may be implemented in arrays of any size, or dimension. Furthermore, where portions of readout circuitry have been identified as being shared by one or more columns of pixels, it should be understood that the circuitry may equivalently be shared by one or more rows of pixels or one or more other groups of pixels.

Embodiments of the present invention can be operated with various switching and timing sequences. For example, where a double sampling technique is used, the transistor switching and timing may vary from a sequence in which no double sampling technique is used. In various embodiments of the present invention described herein, related transistor switching and timing cycles and sequences are provided as examples, and numerous other cycles and sequences are possible as would be obvious to a worker skilled in the art.

The detector may be any type of detector, for example, solid-state photodetectors such as a-Si:H, amorphous selenium or cadmium zinc telluride based detectors and photoconductors, or any other appropriate detector. In addition, direct detection based detectors such as molybdenum Schottky diodes or photoconductors, as well as indirect detection detectors such as those comprising phosphors for example gadolinium oxysulfide detectors, or caesium iodide detectors, may also be used. Any other types of detectors for x-ray detection may further be used as would be readily understood by a worker skilled in the art. The transistors used in various embodiments of the present invention may be amorphous silicon (a-Si:H) thin-film transistors (TFTs), poly-crystalline silicon TFTs, micro-crystalline silicon TFTs, nano-crystalline silicon TFTs, crystalline silicon transistors, or any other similar device as would be readily understood by a worker skilled in the art. In further embodiments, radiation in various regions of the electromagnetic spectrum may be detected using the present invention with the selection of detectors, and devices for the readout circuitry being made in order that an appropriate portion of the electromagnetic spectrum can be detected as would be readily understood by a worker skilled in the art.

As would be readily understood by a worker skilled in the art, the present invention may be applied to various digital imaging applications. For example, the present invention may be applied to medical imaging such as radiography, fluoroscopy, real-time fluoroscopy, mammography or tomosynthesis, or x-ray inspection systems such as in the inspection of aircraft wings, security systems such as screening of luggage at airports, non-destructive material tests, radiography or optical imaging, as well as other forms of digital imaging applications as would be readily understood.

Having fewer on-pixel transistors than standard three-transistor APS is a feature of embodiments of the present invention; smaller area is taken up by the pixel, which can enable higher pixel density and higher image resolution. Reducing the threshold voltage shift of the amplifying transistor by using a switched amplifier instead of a regular transistor is another feature of embodiments of the present invention.

FIG. 3.a illustrates a schematic diagram of one possible configuration of a charge-gated field effect transistor 300 as an embodiment of the present invention. In this embodiment, a second gate 302 is provided for the transistor much like the first. The said first gate 304 is floated and acts as a charge gate, whereas the second gate 302 can be used as the gate of a regular FET. While the device can be normally used as a switch by applying proper voltages to the second gate 302, the device current is modulated by the amount of charge deposited in the first gate 304 (the charge gate) resulting in a switched amplification operation. Implemented in planar configuration, the device structure can be realized by placing drain 306, source 308 and gate 312 of the device side by side, and extending the charge gate 314 over the three conducting terminals (drain 306, source 308 and gate 312) with a dielectric in between as illustrated in FIG. 3.b. This may result in a further simplification of the device structure. The circuit symbol of charge-gated transistor 300 is illustrated in FIG. 3.c, while it can be made using discrete components as shown in FIG. 3.d, which also serves as a model for the device.

Using simple semiconductor device modeling, the drain current of the FET in saturation mode, $I_D$, can be represented as:

$$I_D = \mu C_0 \frac{W}{L}(V_{GS} - V_T)^2 \quad (1)$$

in which, $\mu$ is the carrier mobility, $C_0$, gate capacitance per unit area, W/L, transistor aspect ratio $V_{GS}$, gate to source voltage, and, $V_T$, the threshold voltage. The capacitance of the charge gate to the transistor (to FET channel, including overlaps with drain and source), $C_{CT}$, can be written in terms of $C_0$ as:

$$C_{CT} = C_0 W(L + L_{OV}) \quad (2)$$

where $L_{OV}$ is the total overlap length of the charge gate over drain and source area. Taking the capacitance of the gate to the charge gate to be $C_{GC}$, $V_{GS}$ can be written in terms of the gate voltage, $V_G$, and deposited charge on the charge gate, $\Delta Q$, as:

$$V_{GS} = \frac{C_{GC}}{C_{GC} + C_{CT}} V_G + \frac{\Delta Q}{C_{GC} + C_{CT}} = \frac{C_{GC} V_G + \Delta Q}{C_{GC} + C_{CT}} \quad (3)$$

Substituting $C_0$ and $V_{GS}$ in the drain current equation results in $I_D$ as:

$$I_D = \frac{\mu C_{CT}}{L(L + L_{OV})} \left( \frac{V_G C_{GC} + \Delta Q}{C_{CT} + C_{GC}} - V_T \right)^2 \quad (4)$$

The sensitivity of drain saturation current to deposited charge, or actually the gain of this device is then calculated as:

$$\frac{\partial I_D}{\partial \Delta Q} = \frac{2\mu}{L(L + L_{OV})} \frac{C_{CT}}{C_{CT} + C_{GC}} \left( \frac{V_G C_{GC} + \Delta Q}{C_{CT} + GC} - V_T \right) \quad (5)$$

The drain current in linear mode can be written as follow, using above derivation:

$$I_{DLIN} = \frac{\mu C_{CT}}{L(L + L_{OV})} \left( \frac{V_G C_{GC} + \Delta Q}{C_{CT} + C_{GC}} - V_T - \frac{V_{DS}}{2} \right) V_{DS} \quad (6)$$

Here, the sensitivity of drain linear current to deposited charge can be written as:

$$\frac{\partial I_{DLIN}}{\partial \Delta Q} = \frac{\mu}{L(L + L_{OV})} \frac{C_{CT}}{C_{CT} + C_{GC}} V_{DS} \quad (7)$$

The above calculations show a model for basic device characteristics, and provide basic design equations for employing charge gated field effect transistor in active pixel sensor arrays.

Another embodiment of the present invention is illustrated in FIG. 4.a. where two-transistor multimode pixel sensor architecture 400 has been disclosed. As shown in FIG. 4.b, the pixel sensor 400 can be reset to zero volts by turning on transistor T2 402 and grounding the output 404. This ensures that the gate of transistor T1 406 stays at zero volts, or below, during integration which makes most of the operation time of the array. Sub-threshold voltages at the gate 408 of T1 406 will not cause any threshold voltage increase of T1 406. The preset voltage changes depending upon amount of charge received from the detector 410 during integration time. To read the pixel value in APS mode, a positive voltage pulse is applied to the read line 412. Because the charge gate 408 is floating during the read (T2 402 is OFF, and the detector is ultra high resistive), T1 406 behaves like a charge gated transistor, therefore, depending on the read voltage level (at 412), pixel biasing voltage (at 416) and geometric design of T1 406 and capacitor Cc 418, T1 406 is biased either in saturation or in linear mode, so that the output current (at 404) is determined by equation 4 or 6, respectively, as previously explained.

FIG. 4.c illustrates array configuration 420 of the multimode 2T (two-transistor) pixel architecture according to an embodiment of the present invention. It is worth noting that pixel biasing voltage VBias, could be a global voltage source or provided separately for each row of the array. The array 420 can be read in C-APS or PPS modes using the multimode output column circuit shown in FIG. 4.d, and signal waveforms illustrated in FIGS. 4.*e* and 4.*f* respectively. In either case, the array is entirely reset at first, 461, as illustrated in FIGS. 4.*e*. and 4.*f*., and rows 426*a*, 426*b*, and 426*c* are successively scanned after exposure 462. Vrst 452 is pulsed 463 to discharge Cf 454 and reset the output voltage Vout 456 before reading the next row. In one embodiment, Vent 455 may be grounded, and Vout may be the voltage across capacitor Cf, which is reset to zero volts during the reset operation. Use of current sink 457 is optional, with both $V_{bg}$ and $V_{bd}$ negative. Using the two sample & hold circuits 458 and 459 shown in FIG. 4.*d*, double sampling can be performed to remove fixed pattern noises (FPN) and also to correct for nonuniformities in pixel characteristics across the large area array.

As an alternative to current integrators, transimpedance amplifiers 485 can be used in column circuit 480 as illustrated in FIG. 4.*g*, where the output current of the addressed pixel is immediately converted to an equivalent voltage without time consuming integration operation; same waveforms 460 of FIG. 4.*e* (without Vrst) are used. Use of current sink 487 is optional. The array can also be read in V-APS mode if the output circuit 490 of FIG. 4.*h* is connected to each column, and waveforms 460 of FIG. 4.*e* (without Vrst) are used. This circuit uses a voltage amplifier 496, and output load 497 is optional. As the waveforms of FIG. 4.*i* show, real time scanning of the array is possible when each row is first read 492*a*, 492*b* and then reset 493*a*, 493*b*, however, because the pixel is reset and read via the same output line 494, the required scanning time for each row, Δt 495, is at least equal to the sum of resetting and reading times, which makes the frame rate long using this 2T multimode architecture. Signal waveforms of FIG. 4.*e* can also be adapted for operation of the circuit of FIG. 4.*h*. While the read time can be shortened at the price of pixel output gain, the resetting time remains the limiting factor for how fast an array can be scanned.

In contrast with the architecture presented in FIG. 4.*a* where the pixel sensor is reset through the output line, FIG. 5.*a* illustrates two-transistor pixel sensor architecture 500 with independent reset 502 as another embodiment of the present invention. As shown in FIG. 5.*b*, driving signals 512, 514 for this architecture are similar to the multimode 2T architecture, in addition to the fact that there is no need to ground the output line 504 while pixels are being reset. Therefore it is possible to read one row of the sensor array, while resetting the others. This provides the opportunity to read a high gain APS array much faster than a PPS array with similar image quality. Array configuration 520 of this two transistor active pixel architecture is demonstrated in FIG. 5.*c*. Current mode or voltage mode outputs could be used if column circuits of FIGS. 4.*d* 450, 4.*g* 480, and 4.*h* 490 are connected to the output lines 594 or output 504 in the case of a single pixel. In one embodiment, signal waveforms presented in FIG. 4.*e* can be adapted for operation of the circuit in this case. As signal waveforms of FIG. 5.*d* show, instead of resetting one line at a time, multiple lines are reset 532, 534 at a fraction of the same time, and one line is read 536, 538 at the very time. For example, a charge gain of 15 drops to 3 if the readout time (and so the resetting time) is decreased five times, from 30 μs to 6 μs. Now instead of resetting each row for 30 μs, 5 rows are simultaneously reset for only 6 μs, and the whole resetting window and the row being read sweep the array 520 at the speed of one row per 6 μs (instead of one row per ~30 μs); five times higher frame rate. In one embodiment, high pixel gain makes it possible to reduce readout time, and multiple rows are independently reset which can reduce Δt.

Another embodiment of the present invention is single transistor active pixel architecture 600 as depicted in FIG. 6.*a*. Low voltage detectors 602 such as pin diodes are assumed to be used for this architecture, so that, the pixel sensor is reset by applying a proper bias voltage (at 604) to bias the detector diode in the forward mode. The detector bias voltage (at 604) is then reduced to slightly negative voltages for proper operation of the detector diode 602, an also to make sure that the amplifying transistor, T1 606, is in OFF state. Reading the pixel value is performed as previously explained for 2T-APS architectures (refer to FIG. 6.*b* for different cycles of operation of single transistor APS architecture). The array configuration 610 of the architecture is illustrated in FIG. 6.*c*, where the outputs can be read 612 in current or voltage mode depending on the type of readout circuit connected to the columns (circuits illustrated in FIGS. 4.*d* 450, 4.*g* 480, and 4.*h* 490 could be used for C-APS or V-APS operation modes). By applying signal waveforms 620 of FIG. 6.*d*, the array 610 could be used for single shot scanning, while signals 630 of FIG. 6.*e* can be used for real time scanning.

The embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A digital imaging apparatus comprising:
   a. a detector for generating a first signal in response to photons incident thereupon; and
   b. readout circuitry operatively coupled to the detector, said readout circuitry configured to generate a second signal representative of said first signal, said readout circuitry including an electron device comprising:
      i. a field effect transistor having a gate terminal, a drain terminal and a source terminal; and
      ii. a conductor plate capacitively coupled to the gate terminal of said field effect transistor, wherein current flowing between the drain and source terminals of said field effect transistor can be modulated by a voltage applied to said conductor plate and by an electric charge residing on the gate terminal of said field effect transistor, wherein the electric charge is applied conductively to the gate terminal by the detector,
   the digital imaging apparatus being configured to be operable in two modes of operation, such that in a first mode of operation the first signal is provided at the gate terminal of the field effect transistor, and the current flowing between the drain and source terminals of the field effect transistor results in a signal indicative of the first signal being provided at an output line, and in a second mode of operation, a signal indicative of the first signal is provided at the output line by substantially bypassing the field effect transistor.

2. The digital imaging apparatus according to claim 1, wherein the drain and source terminals are formed in a first plane, the gate terminal is formed in a second plane adjacent to the first plane, and the conductor plate is formed in a third plane adjacent to the second plane.

3. The digital imaging apparatus according to claim 1, wherein the drain and source terminals and the conductor plate are formed in a first plane, and the gate terminal is formed in a second plane adjacent to the first plane.

4. The digital imaging apparatus according to claim 1, further configured such that the first signal is provided at the gate terminal of the field effect transistor, and wherein the current flowing between the drain and source terminals of the field effect transistor is configured to be indicative of the first signal.

5. The digital imaging apparatus according to claim 1, further comprising circuitry configured to selectively apply a predetermined voltage at the conductor plate, application of the predetermined voltage resulting in the current flowing between the drain and source terminals of the field effect transistor being indicative of the first signal.

6. A digital imaging apparatus comprising:
   c. a detector for generating a first signal in response to photons incident thereupon; and
   d. readout circuitry operatively coupled to the detector, said readout circuitry configured to generate a second signal representative of said first signal, said readout circuitry including an electron device comprising:
      i. a field effect transistor having a gate terminal, a drain terminal and a source terminal; and
      ii. a conductor plate capacitively coupled to the gate terminal of said field effect transistor, wherein current flowing between the drain and source terminals of said field effect transistor can be modulated by a voltage applied to said conductor plate and by an electric charge residing on the gate terminal of said field effect transistor, wherein the electric charge is applied conductively to the gate terminal by the detector,
   the digital imaging apparatus configured to be operable in two modes of operation, wherein a first mode of operation includes amplification of the first signal for generating the second signal, and a second mode of operation includes generation of the second signal equal to the first signal.

7. A digital imaging system comprising an array of digital imaging apparatuses, each digital imaging apparatus comprising:
   e. a detector for generating a first signal in response to photons incident thereupon; and
   f. readout circuitry operatively coupled to the detector, said readout circuitry configured to generate a second signal representative of said first signal, said readout circuitry including an electron device comprising:
      i. a field effect transistor having a gate terminal, a drain terminal and a source terminal; and
      ii. a conductor plate capacitively coupled to the gate terminal of said field effect transistor, wherein current flowing between the drain and source terminals of said field effect transistor can be modulated by a voltage applied to said conductor plate and by an electric charge residing on the gate terminal of said field effect transistor, wherein the electric charge is applied conductively to the gate terminal by the detector,
   each digital imaging apparatus being configured to be operable in two modes of operation, such that in a first mode of operation the first signal is provided at the gate terminal of the field effect transistor, and the current flowing between the drain and source terminals of the field effect transistor results in a signal indicative of the first signal being provided at an output line, and in a second mode of operation, a signal indicative of the first signal is provided at the output line by substantially bypassing the field effect transistor.

8. The digital imaging system according to claim 7, wherein a group of two or more digital imaging apparatuses has a common portion of the readout circuitry.

9. The digital imaging system according to claim 8, said system further comprising multiplexing circuitry enabling signals to be multiplexed to the common portion of the readout circuitry.

10. The digital imaging system according to claim 7, wherein one or more groups of one or more digital imaging apparatuses can be selectively addressed by applying voltage at the conductor plates thereof, the applied voltage resulting in currents flowing between the drain and source terminals of the field effect transistors of the selectively addressed digital imaging apparatuses, the currents being indicative of the first signals.

11. The digital imaging system according to claim 10, wherein a digital imaging apparatus from one of the one or more groups of one or more digital imaging apparatuses has a portion of the readout circuitry thereof in common with a digital imaging apparatus from another of the one or more groups.

12. A method of operating one or more selected digital imaging apparatuses in an array thereof, each of the selected digital imaging apparatuses configured as a digital imaging apparatus comprising:
   g. a detector for generating a first signal in response to photons incident thereupon; and
   h. readout circuitry operatively coupled to the detector, said readout circuitry configured to generate a second signal representative of said first signal, said readout circuitry including an electron device comprising:
      i. a field effect transistor having a gate terminal, a drain terminal and a source terminal; and
      ii. a conductor plate capacitively coupled to the gate terminal of said field effect transistor, wherein current flowing between the drain and source terminals of said field effect transistor can be modulated by a voltage applied to said conductor plate and by an electric charge residing on the gate terminal of said field effect transistor, wherein the electric charge is applied conductively to the gate terminal by the detector,
   the digital imaging apparatus configured to be operable in two modes of operation, wherein a first mode of operation includes amplification of the first signal for generating the second signal, and a second mode of operation includes generation of the second signal equal to the first signal, the method comprising capacitively coupling an addressing signal from a corresponding addressing line to the gate of a transistor of each selected digital imaging apparatus.

13. The digital imaging apparatus according to claim 1, wherein the apparatus is applied for mammography, tomosynthesis, radiography, fluoroscopy, real-time fluoroscopy, chest radiography, mammography or digital imaging.

14. The digital imaging apparatus according to claim 6, wherein the drain and source terminals are formed in a first plane, the gate terminal is formed in a second plane adjacent to the first plane, and the conductor plate is formed in a third plane adjacent to the second plane.

15. The digital imaging apparatus according to claim 6, wherein the drain and source terminals and the conductor plate are formed in a first plane, and the gate terminal is formed in a second plane adjacent to the first plane.

16. The digital imaging apparatus according to claim 6, further configured such that the first signal is provided at the gate terminal of the field effect transistor, and wherein the current flowing between the drain and source terminals of the field effect transistor is configured to be indicative of the first signal.

17. The digital imaging apparatus according to claim 6, further comprising circuitry configured to selectively apply a predetermined voltage at the conductor plate, application of the predetermined voltage resulting in the current flowing between the drain and source terminals of the field effect transistor being indicative of the first signal.

18. The digital imaging apparatus according to claim 6, wherein the apparatus is applied for mammography, tomosynthesis, radiography, fluoroscopy, real-time fluoroscopy, chest radiography, mammography or digital imaging.

19. A digital imaging system comprising an array of digital imaging apparatuses, each digital imaging apparatus comprising:
   i. a detector for generating a first signal in response to photons incident thereupon; and
   j. readout circuitry operatively coupled to the detector, said readout circuitry configured to generate a second signal representative of said first signal, said readout circuitry including an electron device comprising:
      i. a field effect transistor having a gate terminal, a drain terminal and a source terminal; and
      ii. a conductor plate capacitively coupled to the gate terminal of said field effect transistor, wherein current flowing between the drain and source terminals of said field effect transistor can be modulated by a voltage applied to said conductor plate and by an electric charge residing on the gate terminal of said field effect transistor, wherein the electric charge is applied conductively to the gate terminal by the detector,
   each digital imaging apparatus configured to be operable in two modes of operation, wherein a first mode of operation includes amplification of the first signal for generating the second signal, and a second mode of operation includes generation of the second signal equal to the first signal.

20. The digital imaging system according to claim 19, wherein a group of two or more digital imaging apparatuses has a common portion of the readout circuitry.

21. The digital imaging system according to claim 19, wherein one or more groups of one or more digital imaging apparatuses can be selectively addressed by applying voltage at the conductor plates thereof, the applied voltage resulting in currents flowing between the drain and source terminals of the field effect transistors of the selectively addressed digital imaging apparatuses, the currents being indicative of the first signals.

* * * * *